(12) United States Patent
Griffith

(10) Patent No.: US 12,418,278 B2
(45) Date of Patent: Sep. 16, 2025

(54) OSCILLATOR WITH FREQUENCY CONTROL

(71) Applicant: TEXAS INSTRUMENTS INCORPORATED, Dallas, TX (US)

(72) Inventor: Danielle Griffith, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/321,105

(22) Filed: May 22, 2023

(65) Prior Publication Data

US 2024/0250667 A1    Jul. 25, 2024

Related U.S. Application Data

(60) Provisional application No. 63/439,939, filed on Jan. 19, 2023.

(51) Int. Cl.
*H03K 3/03*   (2006.01)
*H03K 17/06*   (2006.01)
*H03K 17/687*   (2006.01)

(52) U.S. Cl.
CPC ......... *H03K 3/0315* (2013.01); *H03K 17/063* (2013.01); *H03K 17/687* (2013.01)

(58) Field of Classification Search
CPC ... H03K 3/0315; H03K 17/063; H03K 17/687

USPC .......................................................... 331/57
See application file for complete search history.

(56) References Cited

U.S. PATENT DOCUMENTS

| | | | |
|---|---|---|---|
| 7,432,771 B2 * | 10/2008 | Chui | H03K 4/502 |
| | | | 331/113 R |
| 9,515,667 B2 * | 12/2016 | Samala | H03L 7/18 |
| 10,763,832 B2 * | 9/2020 | Roy | G05F 3/245 |
| 11,437,981 B1 | 9/2022 | Liberti | |
| 2018/0269859 A1 | 9/2018 | Li | |
| 2019/0149140 A1 * | 5/2019 | Han | H03K 3/011 |
| | | | 331/8 |
| 2024/0204757 A1 * | 6/2024 | Goyal | H03K 3/017 |

FOREIGN PATENT DOCUMENTS

WO    2021055155 A1    3/2021

* cited by examiner

*Primary Examiner* — Richard Tan
(74) *Attorney, Agent, or Firm* — Xianghui Huang; Frank D. Cimino

(57) ABSTRACT

A circuit includes a ring oscillator, a current source, an amplifier, a resistor-capacitor (RC) network, and a bias circuit. The current source is configured to power the ring oscillator. The amplifier is configured to control the current source. The amplifier has a first amplifier input and a second amplifier input. The RC network is coupled to the first amplifier input. The bias circuit is coupled to the second amplifier input. The bias circuit is configured to selectably set a frequency range of the ring oscillator, and selectably set a frequency of the ring oscillator within the frequency range.

20 Claims, 5 Drawing Sheets

OSCILLATOR WITH FREQUENCY CONTROL

CROSS-REFERENCE TO RELATED APPLICATIONS

This application claims priority to U.S. Provisional Application No. 63/439,939, filed Jan. 19, 2023, entitled "Low Power Integrated Oscillator with Guaranteed Monotonic and Linear Frequency Control with Fine Step Size," which is hereby incorporated by reference.

BACKGROUND

Most digital circuits include an oscillator to provide clocking for synchronous operation. Different types of oscillators provide different levels of frequency accuracy. Crystal oscillators, and other oscillators using high-Q resonators, provide good frequency accuracy. Resistor-capacitor (RC) oscillators provide somewhat lower frequency accuracy, but offer other advantages. For example, a complete RC oscillator can be fabricated on an integrated circuit, which reduces application circuit complexity and cost.

SUMMARY

In one example, a circuit includes a ring oscillator, a current source, an amplifier, a first capacitor, a first resistor, and a bias circuit. The ring oscillator has a power input. The current source has a control input and a current output. The current output is coupled to the power input. The amplifier has a first amplifier input, a second amplifier input and an amplifier output. The amplifier output is coupled to the control input of the current source. The first resistor and first capacitor are coupled in parallel to the first amplifier input. The bias circuit is coupled to the second amplifier input. The bias circuit includes a second resistor, third resistor, fourth resistor, a fifth resistor, a first switch, and a second switch. The second, third, fourth, and fifth resistors are coupled in series. The first switch is coupled between the second amplifier input and a first terminal of the third resistor. The second switch is coupled between the second amplifier input and a second terminal of the third resistor.

In another example, a circuit includes a ring oscillator, a current source, an amplifier, a resistor-capacitor (RC) network, and a bias circuit. The current source is configured to power the ring oscillator. The amplifier is configured to control the current source. The amplifier has a first amplifier input and a second amplifier input. The RC network is coupled to the first amplifier input. The bias circuit is coupled to the second amplifier input. The bias circuit is configured to selectably set a frequency range of the ring oscillator, and selectably set a frequency of the ring oscillator within the frequency range.

In a further example, a microcontroller circuit includes a processor and an oscillator circuit. The oscillator circuit is coupled to the processor. The oscillator circuit includes a ring oscillator, a current source, an RC network, and a bias circuit. The current source is configured to power the ring oscillator. The amplifier is configured to control the current source. The amplifier has a first amplifier input and a second amplifier input. The RC network is coupled to the first amplifier input. The bias circuit is coupled to the second amplifier input. The bias circuit includes a coarse adjustment circuit and a fine adjustment circuit. The coarse adjustment circuit is configured to selectably set a frequency range of the ring oscillator. The fine adjustment circuit is configured to selectably set a frequency of the ring oscillator within the frequency range.

DETAILED DESCRIPTION

To provide a stable frequency of oscillation, integrated resistor-capacitor (RC) oscillators base the oscillation frequency on resistance and capacitance values. The oscillation frequency is tuned by adjusting the resistance and/or the capacitance. However, the tuning may be nonlinear because oscillator frequency is proportional to RC 1 and the wider the tuning range, the greater the nonlinearity. Wide tuning range and fine step size (small frequency changes) are desirable in some applications. For example, fine step size allows low jitter in applications that modulate a fine trim code to produce a desired frequency. A linear tuning range may allow for equal jitter over the entire tuning range, and a large linear tuning range allows for greater toleration of process, voltage, and temperature variation. A large tuning range also supports the use of variable frequencies in a microcontroller or other digital circuit, where, for example, a higher frequency is used when more computation is required, and a lower frequency is used when less computation is required.

The oscillator circuits described herein provide a wide tuning range with fine trim steps. The total tuning range of the oscillator circuits is divided into multiple smaller sub-ranges. Within the sub-ranges, the tuning steps may be small and monotonic.

Figure 1:
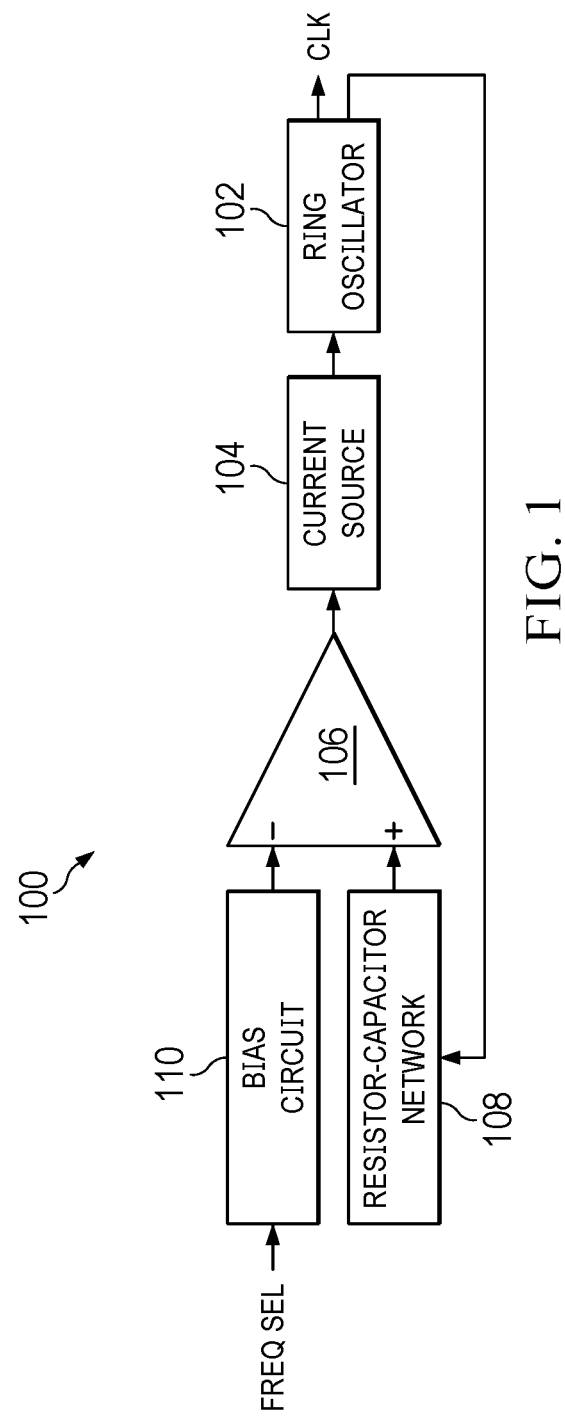
FIG. 1 is a block diagram of an example oscillator with linear frequency control as described herein.

FIG. 1 is a block diagram of an example oscillator 100 with linear frequency control. The oscillator 100 includes a ring oscillator 102, a current source 104, an amplifier 106, a resistor-capacitor (RC) network 108, and a bias circuit 110. The ring oscillator 102 generates an output signal (CLK) having a desired frequency. In some examples, the ring oscillator 102 includes an odd number of inverters connected in series, with an output of a last inverter in the ring (e.g., the inverter providing CLK) coupled to an input of the first inverter in the ring. The frequency of CLK is a function of the delay provided by the ring of inverters. The ring oscillator 102 may also be implemented using an even number of stages, where an odd number of the stages are inverting.

The current source 104 provides a current that powers the ring oscillator 102. A current output of the current source 104 is coupled to a power input of the ring oscillator 102. A higher current increases the voltage across the ring oscillator 102, which decreases the propagation delay of the ring oscillator 102, and increases the frequency of CLK. A lower current decreases the voltage across the ring oscillator 102, which increases the propagation delay of the ring oscillator 102, and decreases the frequency of CLK. A control input of the current source 104 is coupled to the amplifier 106.

The amplifier 106 controls the current source 104 and the frequency of CLK. A first input of the amplifier 106 (e.g., the non-inverting input) is coupled to the RC network 108. A second input of the amplifier 106 (e.g., the inverting input) is coupled to the bias circuit 110. The RC network 108 is coupled to the ring oscillator 102, and generates an output voltage based on the frequency of CLK. The bias circuit 110 generates a bias voltage based on a frequency selection signal (FREQ SEL). The bias circuit 110 may include a string of resistors, and FREQ SEL selects a tap point in the string of resistors from which the bias voltage is provided. The amplifier 106 generates an error signal representative of the difference of the RC network 108 output signal and the bias voltage provided by the bias circuit 110. The error signal controls the current provided by the current source 104 to the ring oscillator 102.

The frequency of CLK is a function of the switched capacitance and resistance included in the RC network 108, and the resistances provided in the bias circuit 110. FREQ SEL selects the resistances in the bias circuit 110 to change the frequency of CLK. The frequency of CLK is linearly proportional to a resistance of the bias circuit 110 selected by FREQ SEL. The oscillator 100 can provide a wide total tuning range (e.g., 50%) with a small frequency step size (e.g., 0.1%), where the frequency steps are linear and monotonic.

Figure 2:
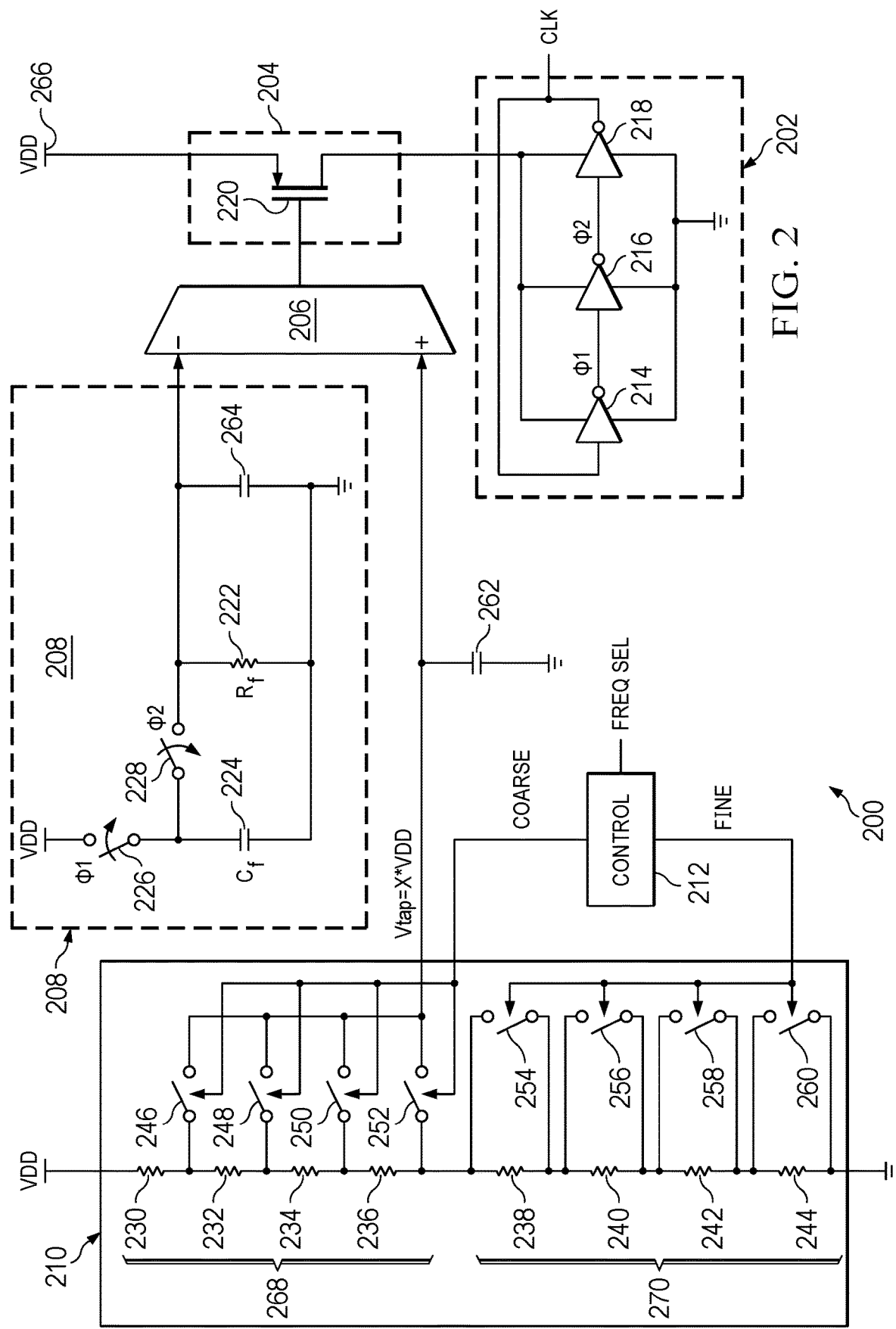
FIG. 2 is schematic diagram of an example oscillator circuit with linear frequency control.

FIG. 2 is schematic diagram of an example oscillator circuit 200 with linear frequency control. The oscillator circuit 200 is an implementation of the oscillator 100. The oscillator circuit 200 includes a ring oscillator 202, a current source 204, an amplifier 206, an RC network 208, a bias circuit 210, and a control circuit 212. The ring oscillator 202, current source 204, amplifier 206, RC network 208, and bias circuit 210 are examples of the ring oscillator 102, current source 104, amplifier 106, RC network 108, and bias circuit 110, respectively. The ring oscillator 202 includes inverters 214, 216, and 218 coupled in series, with the output of each inverter coupled to the input of a next inverter, and the output of the inverter 218 coupled to the input of the inverter 214. While the ring oscillator 202 is illustrated as including three inverters, various examples of the ring oscillator 202 may include any odd number of inverters.

The current source 204 includes a transistor 220 coupled between a power terminal of the ring oscillator 202 and power terminal 266. The transistor 220 may be a p-channel field effect transistor (PFET). Current flows through the transistor 220 to the ring oscillator 202 to produce the voltage powering the inverters 214, 216, and 218. The frequency of CLK generated by the ring oscillator 202 is a function of the voltage powering the ring oscillator 202.

A control input (e.g., gate) of the transistor 220 is coupled to an output of the amplifier 206. The amplifier 206 controls the current flowing through the transistor 220 to control frequency of CLK. A first input (e.g., non-inverting input) of the amplifier 206 is coupled to the RC network 208, and a second input (e.g., inverting input) of the amplifier 206 is coupled to the bias circuit 210. The RC network 208 includes a resistor 222, a capacitor 224, a switch 226, and a switch 228. The resistance of the resistor 222 may be fixed (non-variable). The switch 226 and the switch 228 are coupled to the ring oscillator 202, which provides intermediate signals as control signals φ1 and φ2, where φ1 is the inverse of φ2. φ1 controls opening and closing of the switch 226, and φ2 controls opening and closing of the switch 228. The oscillator circuit 200 may include level shifters that shift the control signals φ1 and φ2 to the power supply voltage VDD. The capacitor 224 is charged while the switch 226 is closed and discharged (through the resistor 222) while the switch 228 is closed to develop the voltage provided at the first input of the amplifier 206. The RC network 208 may also include the capacitor 264 in parallel with the resistor 222 to provide filtering.

The bias circuit 210 provides a bias voltage to the amplifier 206. The amplifier 206 generates an error signal representative of the difference in the bias voltage and output signal of the RC network 208. The error signal controls the transistor 220. The bias circuit 210 includes resistors coupled in series between the power terminal 266 and a ground terminal, and switches coupled to the resistors. The switches select the bias voltage provided to the amplifier 206.

The bias circuit 210 includes a coarse adjustment circuit 268 and a fine adjustment circuit 270. The coarse adjustment circuit 268 includes resistors 230, 232, 234, and 236, and switches 246, 248, 250, and 252. The fine adjustment circuit 270 includes resistors 238, 240, 242, and 244, and switches 254, 256, 258, and 260. The resistors 230, 232, 234, 236, 238, 240, 242, and 244 are coupled in series between the power terminal 266 and the ground terminal. The resistors 238, 240, 242, and 244 may be unit resistors having a same value of resistance. The resistors 230, 232, 234, and 236 may each have a same resistance that is greater than (e.g., an integer multiple of) the resistance of the unit resistor. For example, each of the resistors 230, 232, 234, and 236 may include multiple (e.g., 2, 10, 100, etc.) unit resistors coupled in series. While the coarse adjustment circuit 268 and the fine adjustment circuit 270 are illustrated as including four resistors as a matter of convenience, various examples of the coarse adjustment circuit 268 and fine adjustment circuit 270 may include more resistors. For example, the fine adjustment circuit 270 may include 64, 100, or any other number of unit resistors coupled in series. The coarse adjustment circuit 268 may include 5, 10, or any other number of resistors coupled in series.

The switch 246 is coupled to the node connecting the resistor 230 and the resistor 232 to form a first tap point. The switch 248 is coupled to the node connecting the resistor 232 and the resistor 234 to form a second tap point. The switch 250 is coupled to the node connecting the resistor 234 and the resistor 236 to form a third tap point. One of the switches 246, 248, 250, or 252 is closed select a bias voltage provided to the amplifier 206. The bias voltage may be expressed as: Vtap=X*VDD, where X is the division ratio selected by closing one of the switches 246, 248, 250, or 252.

The switch 254 is coupled in parallel with the resistor 238. The switch 256 is coupled in parallel with the resistor 240. The switch 258 is coupled in parallel with the resistor 242. The switch 260 is coupled in parallel with the resistor 244. Accordingly, each of the switches 254, 256, 258, or 260 may be closed to bypass the resistor in parallel with the switch. The switches 254, 256, 258, or 260 are opened or closed to change the resistance between the ground terminal and the bias voltage tap point selected by closing one of the switches 246, 248, 250, or 252. For example, all of the switches of the fine adjustment circuit 270 are open to generate a first frequency of CLK, one of the switches of the fine adjustment circuit 270 is closed to generate a second frequency of CLK, two of the switches of the fine adjustment circuit 270 are closed to generate a third frequency of CLK, etc.

The frequency of CLK generated by the oscillator circuit 200 ($F_{CLK}$) may be expressed as:

$$F_{CLK} = \frac{R_2}{R_1 R_F C_F} \quad (1)$$

where:
$C_F$ is the capacitance of the capacitor 224;
$R_F$ is the resistance of the resistor 222;
$R_1$ is the resistance between the power terminal 266 and the selected bias voltage tap point; and
$R_2$ is the resistance between the selected bias voltage tap point and ground.

$F_{CLK}$ is linearly proportional to $R_2$. A frequency range is selected to implement a coarse trim by closing one of the switches of the coarse adjustment circuit 268 (e.g., one of switches 246, 248, 250, or 252) to set $R_1$ and an initial value of $R_2$. Within the selected frequency range, fine frequency selection (fine trim) is provided by closing one or more of the switches of the fine adjustment circuit 270 (e.g., switches 254, 256, 258, or 260) to adjust $R_2$.

The control circuit 212 provides the control signals COARSE and FINE that control the switches of the coarse adjustment circuit 268 and the fine adjustment circuit 270. The COARSE control signals may include as many signals as needed to control the switches of the coarse adjustment circuit 268, and the FINE control signals may include as many signals as needed to control the switches of the fine adjustment circuit 270. For example, the COARSE control signals may include a control signal for each switch of the coarse adjustment circuit 268, and the FINE control signals may include a control signal for each switch of the fine adjustment circuit 270. The control circuit 212 may be implemented in a microcontroller or other digital circuit. The control circuit 212 receives the signal FREQ SEL that specifies a value of $F_{CLK}$, and the control circuit 212 sets the COARSE and FINE control signals to open/close the switches of the bias circuit 210 to select $R_1$ and $R_2$, and produce $F_{CLK}$ according to equation (1).

Figure 3:
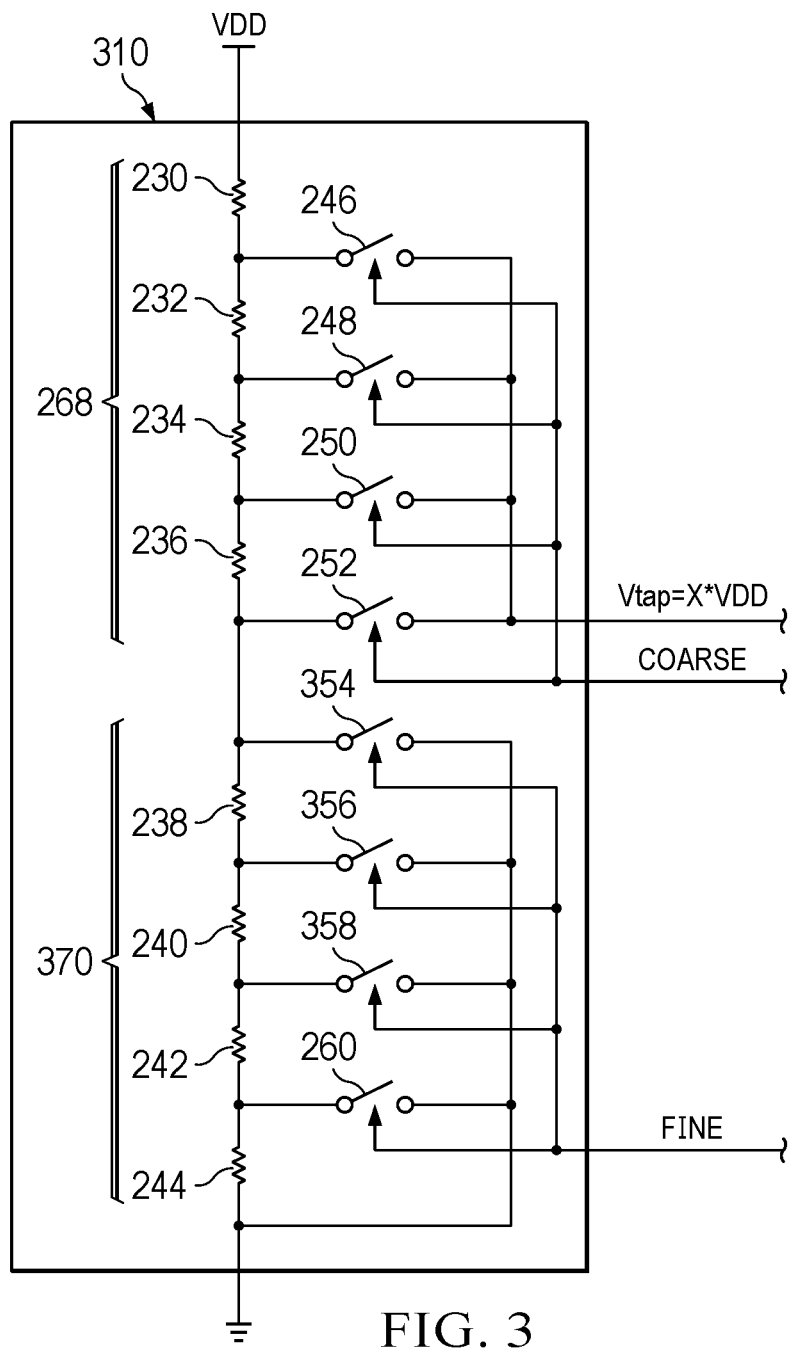
FIG. 3 is a schematic diagram of an example alternative bias circuit suitable for use in the oscillator circuit of FIG. 2.

FIG. 3 is a schematic diagram of an example alternative bias circuit 310 suitable for use in the oscillator circuit 200. The bias circuit 310 is similar to the bias circuit 210 and may be used in the oscillator circuit 200 in place of the bias circuit 210. In the bias circuit 310, the coarse adjustment circuit 268 is the same in the bias circuit 210. The bias circuit 310 includes the fine adjustment circuit 370 in place of the fine adjustment circuit 270 of the bias circuit 210. The fine adjustment circuit 370 includes the resistors 238, 240, 242, and 244, and the switch 260 as in the bias circuit 210. The switch 260 is coupled in parallel with the resistor 244 to bypass the resistor 244 when closed. The fine adjustment circuit 370 also includes the switches 354, 356, and 358. The switch 358 is coupled in parallel with the resistors 244 and 242 to bypass the resistors 244 and 242 when closed. The switch 356 is coupled in parallel with the resistors 244, 242, and 240 to bypass the resistors 244, 242, and 240 when closed. The switch 354 is coupled in parallel with the resistors 244, 242, 240, and 238 to bypass the resistors 244, 242, 240, and 238 when closed. The control circuit 212 generates the COARSE control signals to select a bias voltage tap, and generates the FINE control signals to open or close the switches 260, 358, 256, or 354 to select $R_1$ and $R_2$, and produce a desired $F_{CLK}$ in the oscillator circuit 200.

Figure 4:
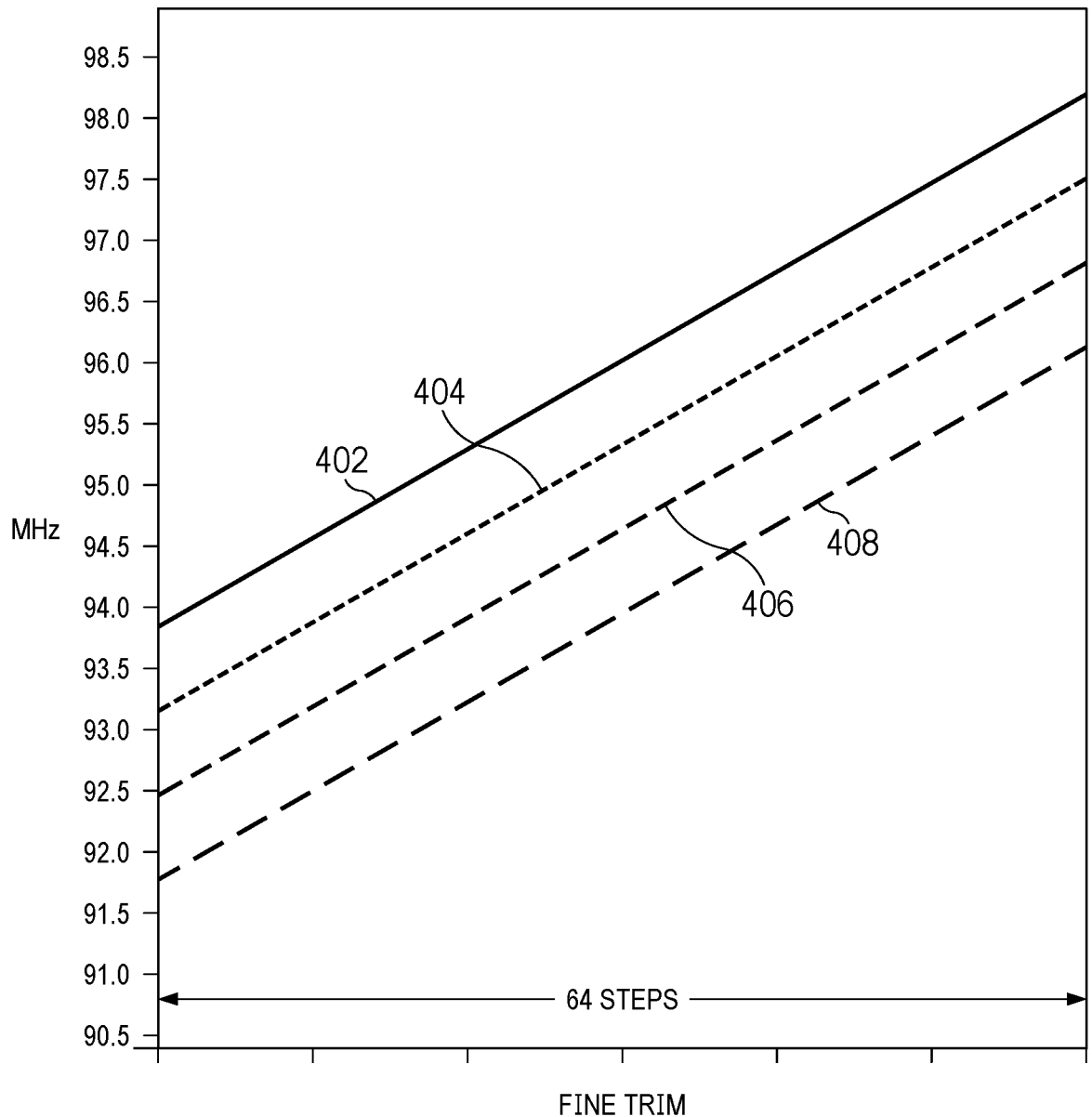
FIGS. 4 and 5 are graphs showing example coarse and fine frequency ranges in the oscillator circuit of FIG. 2.

FIG. 4 is a graph of frequencies generated in an example of the oscillator circuit 200. The y-axis represents frequency in megahertz and the x-axis represents fine trim step values. In FIG. 4, the graph 402 shows frequency generated by the oscillator circuit 200 given selection of a first bias voltage tap of the bias circuit 210 (e.g., switch 246 closed, switches 248, 250, and 252 open). The graph 404 shows frequency generated by the oscillator circuit 200 given selection of a second bias voltage tap of the bias circuit 210 (e.g., switch 248 closed, switches 246, 250, and 252 open). The graph 406 shows frequency generated by the oscillator circuit 200 given selection of a third bias voltage tap of the bias circuit 210 (e.g., switch 250 closed, switches 246, 248, and 252 open). The graph 408 shows frequency generated by the oscillator circuit 200 given selection of a fourth bias voltage tap of the bias circuit 210 (e.g., switch 252 closed, switches 246, 248, and 250 open).

The frequency ranges shown in each of the graphs 402-408 are selected by the COARSE control signals. In FIG. 4, the fine adjustment circuit 270 includes 64 unit resistors in series and 64 switches that provide 64 fine frequency trim steps. The change in frequency with each fine trip step is based on the resistance of the each of the unit resistors of the fine adjustment circuit 270. Similarly, the frequency spacing of the graphs 402-408 (the change in frequency with selection of successive bias voltage taps) is a function of the resistance of the resistors of the coarse adjustment circuit 268. In the implementation illustrated in FIG. 4, the resistors of the coarse adjustment circuit 268 produce frequency ranges that are relatively close to one another with significant overlap.

Figure 5:
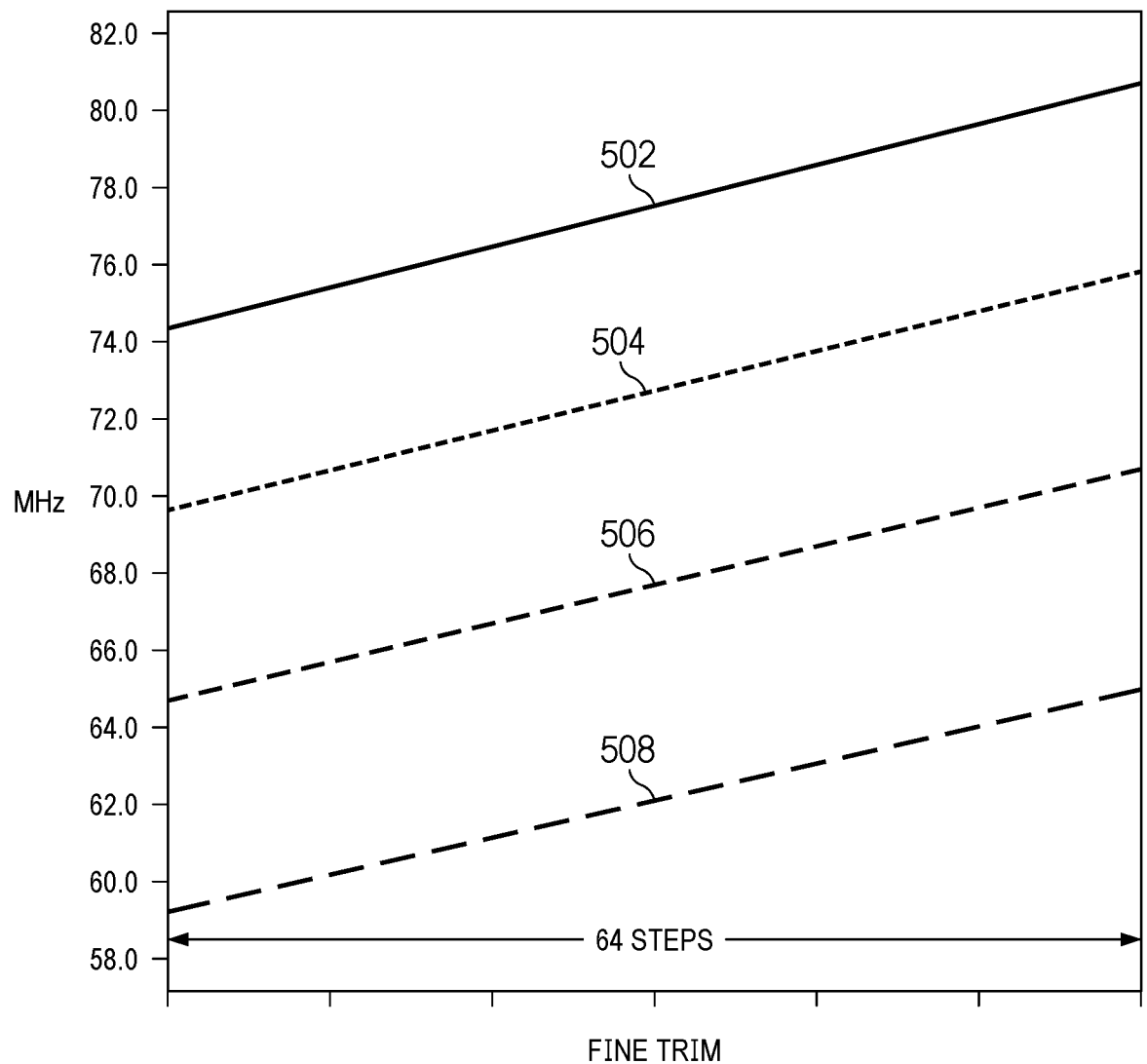

FIG. 5 is a graph of frequencies generated in another example of the oscillator circuit 200. The y-axis represents frequency in megahertz and the x-axis represents fine trim step values. In FIG. 5, the graph 502 shows frequency generated by the oscillator circuit 200 given selection of a first bias voltage tap of the bias circuit 210 (e.g., switch 246 closed, switches 248, 250, and 252 open). The graph 504 shows frequency generated by the oscillator circuit 200 given selection of a second bias voltage tap of the bias circuit 210 (e.g., switch 248 closed, switches 246, 250, and 252 open). The graph 506 shows frequency generated by the oscillator circuit 200 given selection of a third bias voltage tap of the bias circuit 210 (e.g., switch 250 closed, switches 246, 248, and 252 open). The graph 508 shows frequency generated by the oscillator circuit 200 given selection of a fourth bias voltage tap of the bias circuit 210 (e.g., switch 252 closed, switches 246, 248, and 250 open).

The frequency ranges shown in each of the graphs 502-508 are selected by the COARSE control signals. In FIG. 5, the fine adjustment circuit 270 includes 64 unit resistors in series and 64 switches that provide 64 fine frequency trim steps. The change in frequency with each fine trip step is based on the resistance of the each of the unit resistors of the fine adjustment circuit 270. Similarly, the frequency spacing of the graphs 502-508 (the change in frequency with selection of successive bias voltage taps) is a function of the resistance of the resistors of the coarse adjustment circuit 268. In the implementation illustrated in FIG. 5, the resistors of the coarse adjustment circuit 268 produce frequency ranges that are spaced farther apart than the frequency ranges shown in FIG. 4, with relatively little overlap between the frequency ranges.

Figure 6:
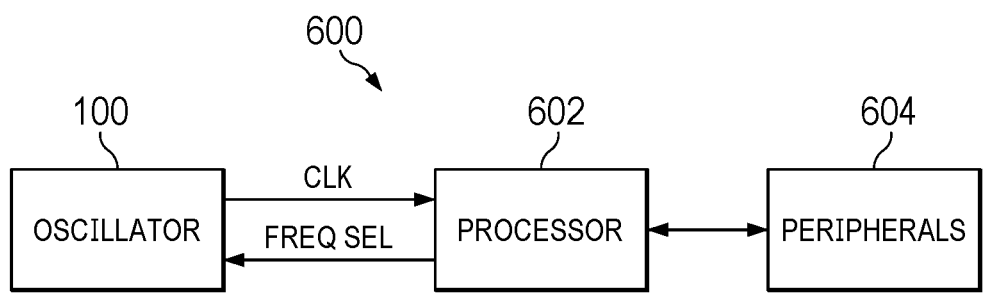
FIG. 6 is a block diagram of an example microcontroller circuit that includes the oscillator circuit of FIG. 1.

FIG. 6 is a block diagram of an example microcontroller circuit 600. The microcontroller circuit 600 includes the oscillator 100 (or the oscillator circuit 200), a processor 602, and peripherals 604. The processor 602 may be a general-purpose microprocessor core or any other instruction execution device or digital logic circuit. The peripherals 604 are coupled to the processor 602. The peripherals 604 may be configured and controlled by the processor 602, and the peripherals 604 may provide services to the processor 602. For example, the peripherals 604 may include timers, communication circuits, interrupt control circuits, analog-to-digital converters, and other peripheral circuits.

The oscillator 100 is coupled to the processor 602. The oscillator 100 may also be coupled to the peripherals 604. The oscillator 100 provides CLK to the processor 602, and the processor 602 provides the signal FREQ SEL that the oscillator 100 uses to control adjustment of the frequency of CLK. The oscillator 100 provides low frequency variation over temperature with a wide tuning range and linear fine frequency trim.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A circuit comprising:
a ring oscillator having a power input;
a current source having a control input and a current output, the current output coupled to the power input, and
an amplifier having a first amplifier input, a second amplifier input and an amplifier output, the amplifier output coupled to the control input of the current source;
a first resistor and a first capacitor coupled in parallel and further coupled to the first amplifier input; and

9 a bias circuit coupled to the second amplifier input, the bias circuit including:
  second, third, fourth, and fifth resistors coupled in series;
  a first switch coupled between the second amplifier input and a first terminal of the third resistor;
  a second switch coupled between the second amplifier input and a second terminal of the third resistor;
  a third switch coupled in parallel with the fourth resistor; and
  a fourth switch coupled in parallel with the fifth resistor,
wherein:
  a first resistance of the second resistor is equal to a second resistance of the third resistor;
  a third resistance of the fourth resistor is equal to a fourth resistance of the fifth resistor; and
  the first resistance is larger than the third resistance.

2. The circuit of claim 1, wherein the fourth switch is further coupled to a ground terminal.

3. The circuit of claim 1, wherein the second, third, fourth, and fifth resistors are coupled in series between a power terminal and a ground terminal.

4. The circuit of claim 1, wherein:
the first resistance is at least twice the third resistance.

5. The circuit of claim 1, wherein the first resistor has a fixed resistance.

6. The circuit of claim 1, further comprising:
a fifth switch coupled between a first terminal of the first capacitor and a first terminal of the first resistor; and
a sixth switch coupled between the first terminal of the first capacitor and a power terminal.

7. The circuit of claim 1, wherein the bias circuit is configured to:
selectably set a frequency range of the ring oscillator by controlling the first switch and the second switch.

8. The circuit of claim 7, wherein the bias circuit is configured to:
selectably set a frequency of the ring oscillator within the frequency range by controlling the third switch and the fourth switch.

9. A circuit comprising:
a ring oscillator;
a current source configured to power the ring oscillator;
an amplifier configured to control the current source, the amplifier having a first amplifier input and a second amplifier input;
a resistor-capacitor (RC) network coupled to the first amplifier input; and
a bias circuit coupled to the second amplifier input and comprising:
  a first resistor, a second resistor, a third resistor, and a fourth resistor coupled in series;
  a first switch coupled between a first terminal of the second resistor and the second amplifier input;
  a second switch coupled between a second terminal of the second resistor and the second amplifier input;
  a third switch coupled in parallel with the third resistor; and
  a fourth switch coupled in parallel with the fourth resistor,
wherein the bias circuit is configured to:
  selectably set a frequency range of the ring oscillator; and
  selectably set a frequency of the ring oscillator within the frequency range, and

10 wherein:
  a first resistance of the first resistor is equal to a second resistance of the second resistor;
  a third resistance of the third resistor is equal to a fourth resistance of the fourth resistor; and
  the first resistance is larger than the third resistance.

10. The circuit of claim 9, wherein the bias circuit is configured to:
close the first switch and open the second switch to selectably set the ring oscillator to a first frequency range; and
close the second switch and open the first switch to selectably set the ring oscillator to a second frequency range.

11. The circuit of claim 8, wherein:
the bias circuit is configured to:
  close the third switch to selectably set the frequency of the ring oscillator to a first frequency in the frequency range; and
  close the fourth switch to selectably set the frequency of the ring oscillator to a second frequency in the frequency range.

12. The circuit of claim 9, wherein:
the fourth switch is further coupled to a ground terminal.

13. The circuit of claim 9, wherein:
the first resistance is at least twice the third resistance.

14. The circuit of claim 9, wherein:
the RC network includes:
  a fifth resistor coupled between the first amplifier input and a ground terminal;
  a capacitor coupled in parallel with the fifth resistor;
  a fifth switch coupled between the capacitor and a power terminal; and
  a sixth switch coupled between the fifth resistor and the capacitor.

15. The circuit of claim 9, wherein the first, second, third, and fourth resistors are coupled in series between a power terminal and a ground terminal.

16. A microcontroller circuit comprising:
a processor;
an oscillator circuit coupled to the processor, the oscillator circuit including:
  a ring oscillator;
  a current source configured to power the ring oscillator;
  an amplifier configured to control the current source, the amplifier having a first amplifier input and a second amplifier input;
  a resistor-capacitor (RC) network coupled to the first amplifier input; and
  a bias circuit coupled to the second amplifier input, the bias circuit including:
    a coarse adjustment circuit including:
      a first resistor and a second resistor coupled in series;
      a first switch coupled between a first terminal of the second resistor and the second amplifier input; and
      a second switch coupled between a second terminal of the second resistor and the second amplifier input; and
    a fine adjustment circuit including:
      a third resistor and a fourth resistor coupled in series with the first resistor and the second resistor;
      a third switch coupled in parallel with the third resistor; and
      a fourth switch coupled in parallel with the fourth resistor, wherein:
a first resistance of the first resistor is equal to a second resistance of the second resistor;
a third resistance of the third resistor is equal to a fourth resistance of the fourth resistor; and
the first resistance is larger than the third resistance.

17. The microcontroller circuit of claim 16, wherein the first resistance is at least twice the third resistance.

18. The microcontroller circuit of claim 16, wherein the bias circuit is configured to:
close the first switch and open the second switch to selectably set the ring oscillator to a first frequency range; and
close the second switch and open the first switch to selectably set the ring oscillator to a second frequency range.

19. The microcontroller circuit of claim 16, wherein the coarse adjustment circuit is configured to selectably set a frequency range of the ring oscillator, and the fine adjustment circuit is configured to selectably set a frequency of the ring oscillator within the frequency range.

20. The microcontroller circuit of claim 19, wherein the bias circuit is configured to:
close the third switch to selectably set the ring oscillator to a first frequency in the frequency range; and
close the fourth switch to selectably set the ring oscillator to a second frequency in the frequency range.

* * * * *